United States Patent
Yang et al.

(10) Patent No.: US 10,714,679 B2
(45) Date of Patent: Jul. 14, 2020

(54) CMP STOP LAYER AND SACRIFICE LAYER FOR HIGH YIELD SMALL SIZE MRAM DEVICES

(71) Applicant: Taiwan Semiconductor Manufacturing Company, Ltd., Hsinchu (TW)

(72) Inventors: Yi Yang, Fremont, CA (US); Zhongjian Teng, Santa Clara, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/891,767

(22) Filed: Feb. 8, 2018

(65) Prior Publication Data
US 2019/0245141 A1    Aug. 8, 2019

(51) Int. Cl.
| H01L 43/12 | (2006.01) |
| H01L 27/22 | (2006.01) |
| C09G 1/02 | (2006.01) |
| H01L 43/08 | (2006.01) |
| H01L 43/02 | (2006.01) |
| G11C 11/16 | (2006.01) |

(52) U.S. Cl.
CPC .......... *H01L 43/12* (2013.01); *C09G 1/02* (2013.01); *G11C 11/161* (2013.01); *H01L 27/222* (2013.01); *H01L 43/02* (2013.01); *H01L 43/08* (2013.01)

(58) Field of Classification Search
None
See application file for complete search history.

(56) References Cited

U.S. PATENT DOCUMENTS

| 8,975,088 | B2 | 3/2015 | Satoh et al. | |
| 9,070,869 | B2 | 6/2015 | Jung et al. | |
| 9,397,139 | B1 | 7/2016 | Tan et al. | |
| 9,780,301 | B1 | 10/2017 | Chuang et al. | |
| 2006/0054947 | A1* | 3/2006 | Asao | H01L 43/08 257/295 |
| 2010/0193891 | A1 | 8/2010 | Wang et al. | |
| 2015/0091109 | A1* | 4/2015 | Allinger | H01L 23/552 257/421 |
| 2016/0181512 | A1* | 6/2016 | Ahn | H01L 43/08 257/421 |
| 2017/0047510 | A1* | 2/2017 | Chen | H01L 43/08 |
| 2017/0053965 | A1* | 2/2017 | Baek | H01L 27/228 |

(Continued)

OTHER PUBLICATIONS

EPO Search Report, Application No. 19156079.6 dated Jun. 27, 2019, 8 pages.

*Primary Examiner* — Nilufa Rahim
(74) *Attorney, Agent, or Firm* — Haynes and Boone, LLP

(57) ABSTRACT

An array, such as an MRAM (Magnetic Random Access Memory) array formed of a multiplicity of layered thin film devices, such as MTJ (Magnetic Tunnel Junction) devices, can be simultaneously formed in a multiplicity of horizontal widths in the 60 nm range while all having top electrodes with substantially equal thicknesses and coplanar upper surfaces. This allows such a multiplicity of devices to be electrically connected by a common conductor without the possibility of electrical opens and with a resulting high yield.

20 Claims, 3 Drawing Sheets

(56) References Cited

U.S. PATENT DOCUMENTS

2017/0243919 A1    8/2017  Seong et al.
2018/0205002 A1*  7/2018  Bak ...................... H01L 27/228
2018/0261649 A1*  9/2018  Annunziata ........... H01L 27/222

* cited by examiner

| Slurry | pH value | Main Particle | Polish Rate For Encap (SiN) (A/min) | Polish Rate For CMP Sacrifice Layer (TiN) (A/min) | Polish Rate For CMP Stop Layer (TiN) (A/min) |
|---|---|---|---|---|---|
| Slurry1 | 5.0-6.0 | Zirconium Oxide | 550 | 50 | N/A |
| Slurry2 | 3.0-5.0 | Aluminum Oxide | N/A | 700 | 5 |

FIG. 2

CMP STOP LAYER AND SACRIFICE LAYER FOR HIGH YIELD SMALL SIZE MRAM DEVICES

BACKGROUND

1. Technical Field

This disclosure relates generally to the fabrication of magnetoresistive random access memory (MRAM) devices, specifically to methods of depositing and patterning multi-layered MTJ cells.

2. Description of the Related Art

Fabrication of magnetoresistive random-access memory (MRAM) devices normally involves a sequence of processing steps during which many layers of metals and dielectrics are deposited to form a stack and then the stack is patterned to form an array of separated magnetoresistive devices, such as MTJ (magnetic tunneling junctions) as well as top and bottom electrodes for making electrical connections to the devices. To define those magnetic tunnel junction (MTJ) cells in each MRAM device and make them non-interacting with each other (until such interconnections may be desired), precise patterning steps including photolithography and plasma etch such as reactive ion etching (RIE), ion beam etching (IBE) or their combination are usually involved. During photolithography, patterns are transferred from a photomask to a light-sensitive photoresist, then subsequently transferred to define arrays of MTJ devices by plasma etches, forming separate and non-interacting MTJ devices. After plasma etching, smaller size devices in the patterned array usually have less top electrode left because the photoresist covering them is consumed more quickly during this etching process. As a result of the disparity in electrode thicknesses which creates a non-planar top surface, it is challenging for the final top metal contact to connect them, resulting in open devices (devices where poor contacts are made). New approaches are needed if one wants to achieve high yield on small sizes (e.g. sub 60 nm) of MTJ devices. It must be noted that several prior art patents disclose approaches to address some of the difficulties alluded to above. For example, U.S. Pat. No. 9,070,869 (Jung et al) discloses a variety of layer constructions and U.S. Pat. No. 8,975,088 (Satoh et al) teaches several different masking layers. However, neither of these prior arts teach the methods to be disclosed herein nor do they demonstrate the results that are obtained by application of those methods.

SUMMARY

An object of the present disclosure is to provide a method of improving the yield of arrays of small-sized layered MTJ devices and of a multiplicity of such devices of various dimensions, by adding additional layers between the hard mask used for patterning such MTJ devices and the electrode that is the top layer of the MTJ stack to be patterned.

A further object of the present disclosure is to provide such a yield improvement that can be attributed to eliminating electrical opens associated with damage to the very small top electrodes.

A still further object of the present disclosure is to provide the above stated benefits to a multiplicity of MTJ devices of various sizes adjacently disposed and being simultaneously processed on a common substrate.

In typical prior art processes, patterns are transferred from photoresist to a dielectric hard mask, then to a top electrode, and then to the MTJ stack beneath the top electrode. After the etch process to complete the pattern transfer, the remaining portion of the top electrode on the smaller portions of the pattern is found to be reduced in size when the pattern feature sizes are 60 nm and below, resulting in an electric open (a failure in electrical conductivity) and great yield loss.

To eliminate these difficulties, the presently disclosed method inserts a CMP (chemical mechanical polishing) stop layer and a sacrifice layer between the photoresist hard mask pattern and the electrode. After plasma etch, any photoresist consumption difference would only result in different thicknesses (heights) of CMP sacrifice layer patterns. The top electrode thickness remains the same for all sizes of devices due to the protection of the CMP stop layer. By choosing proper slurries during the following CMP process, any remaining sacrifice patterns are completely removed, stopping on the CMP stop layer. The CMP stop layer is then removed by plasma etch, exposing the top electrode underneath. Using this method, different size MTJ cells retain the same height of their top electrode, making it easier to connect the later deposited top metal contact.

Any yield loss due to electric opens is avoided. This method benefits the future generation of sub 60 nm MRAM products as well as other fabrications having small sizes.

BRIEF DESCRIPTION OF THE DRAWINGS

FIG. 2 is a table describing two slurries used to create CMP polishes with different polishing rates on different elements of a layered MRAM device.

DETAILED DESCRIPTION

A schematic set of Illustrations of the process flow is shown in FIGS. 1A-1F, where there is shown the application of the method to simultaneously create two adjacent exemplary MTJ devices of different sizes but having top electrodes of substantially the same heights and coplanar upper surfaces so that the devices may be advantageously connected by a common metal contact without the formation of electrical opens (open circuits).

Figure 1A:
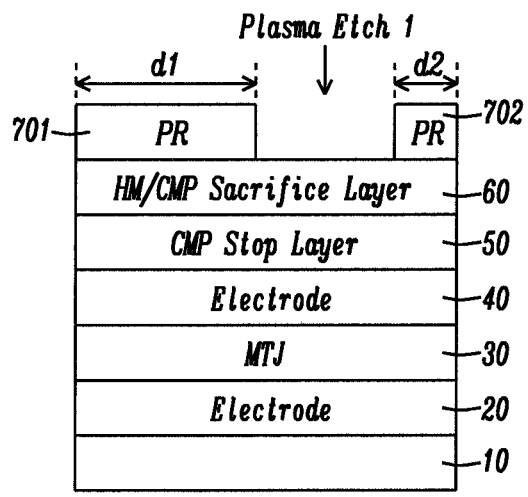
FIGS. 1A, 1B, 1C, 1D, 1E and 1F is a series of schematic illustrations showing the process flow of fabricating high yield MRAM devices of various sizes.

Referring first to FIG. 1A, there is schematically shown a single stack structure about to be patterned into two adjacent but separated MTJ devices by a first plasma etch. It is understood that two devices are exemplary to simplify the description and an array comprising a multiplicity of such separated devices is contemplated. We note here that the MTJ device is one type of active device element that may be processed using the following methodology, but any type of active multilayered device may be formed into an array including devices of various widths and provided with top electrodes having coplanar upper surfaces on which a single electrically connecting layer may be advantageously formed with no open circuits between array elements.

From the bottom up, there is shown a substrate layer 10, which may be a common electrical contact such as a layer of Ta, TaN, Ti or TiN or the top of an additional integrated electronic structure, a bottom electrode 20, a multilayered MTJ stack 30, a top electrode 40 of thickness between approx. 200-1000 A, a CMP stop layer 50 of thickness between approx. 20-300 A, a CMP sacrifice layer 60, of thickness between approx. 200-1000 A which is either alone or formed in combination with a hard mask (HM) layer (not separately shown) of thickness between approx. 200-2000 A. The additional hard mask (HM) layer, which is not shown here, may be deposited on the sacrifice layer 60 to improve the subsequent plasma etch selectivity. Note, the addition of a dielectric hard mask (HM) layer to improve the etch selectivity while etching the CMP sacrifice layer can be thought of as producing a "thick hard mask", where the combination works together to improve overall selectivity. For example, one can use plasma gas species such as CHF3, CH2F2 or C4F8 that will readily etch the HD, but which has a very low etch rate on the photoresist. Finally a photoresist layer (PR) is formed to a thickness of between approx. 1000-3000 A on the hard mask (if present) or sacrifice layer 60. The photoresist layer is shown as already having been photolithographically patterned into two portions, 701 and 702 of dimension d1 and d2 respectively, which will ultimately lead to the formation of two MTJ devices of those dimensions. The top electrode 40, deposited freely on top of the MTJ stack 30, is a layer of conducting material such as Ta, Ti, TaN or TiN. The CMP stop layer 50, is a layer of SiO2 or SiON and is deposited on the top electrode. The CMP sacrifice layer 60 is a layer of Ta, Ti, TaN and TiN and it is then deposited onto the CMP stop layer. Alternatively, to improve the subsequent plasma etch selectivity and pattern integrity, a dielectric hard mask, such as layer of SiN, SiO2 or SiON can be deposited on top of the CMP sacrifice layer (not specifically shown). Photoresist patterns 701 and 702 are formed by photolithography as is well known in the art. As also shown in FIG. 1a, two exemplary photoresist pattern sizes of d1 and d2, where d1>d2, are created here to help better understand how this method works. For this example, the width d1 is approx. 60-100 nm and d2 is approx. 10-60 nm.

An important aspect of the exemplary process being shown herein is that one of the MTJ devices is larger (in horizontal dimension) than the other so that the etching process also leads to a different thickness (vertical dimension) which can have negative impact on process yields. A first plasma etch is shown being applied to the opening between 701 and 702 to separate the stack.

Figure 1B:
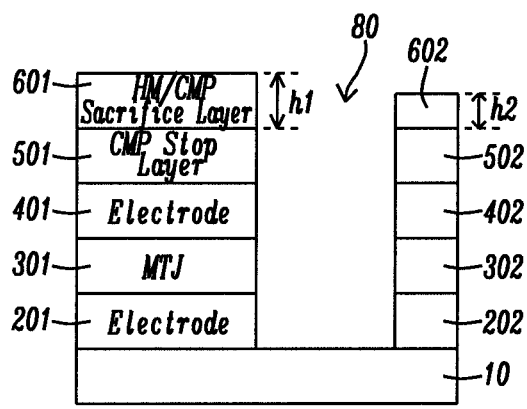

Referring next to FIG. 1B, there is shown the structure of FIG. 1A after a plasma etch (reactive ion RIE, ion-beam IBE or their combination) of the whole stack which leaves a space 80 between two remaining portions each of substantially uniform width d1 and d2 respectively. The portion of the stack having the larger size d1 includes a remaining CMP sacrifice layer portion 601 having a final thickness h1 that is larger than h2, the thickness of the smaller size pattern's CMP sacrifice layer 602. This final thickness difference is because the smaller layer of photoresist (702 in FIG. 1A) over the now smaller size pattern portion 602, is consumed more quickly during the plasma etch process, leading to part of the CMP sacrifice layer 602 being etched away as well. One can imagine that if the top electrode (40 in FIG. 1A) were located directly underneath the photoresist and/or the not-shown dielectric hard mask HM, then it would be the electrode portions 401 and 402 that would be left with different thicknesses instead of 601 and 602.

Figure 1C:
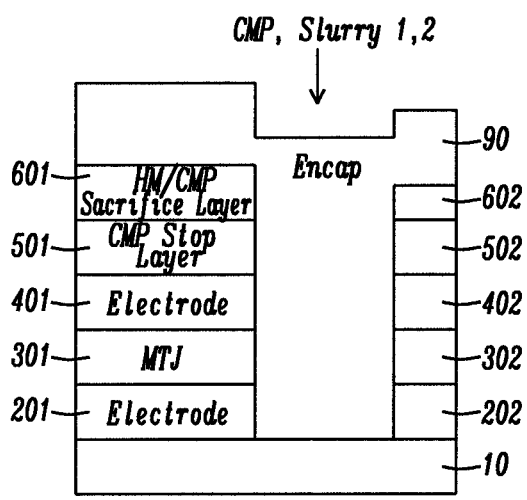

As shown in schematic FIG. 1C, after plasma etch, an encapsulation layer 90 is deposited into the patterned MTJ stack filling the space 80 (in FIG. 1B) between them. This layer is typically SiN, SC, or SiCN and is deposited by chemical vapor deposition (CVD). Next as also shown in FIG. 1C, a first CMP is applied, using slurry 1 as listed in Table 1, that provides a high polish rate for the encapsulation materials 80 as well as the alternative additional dielectric hard mask (if one is used). This first CMP process is applied to completely remove an upper portion of the encapsulation layer and additional hard mask portions (if present), stopping at the remaining CMP sacrifice layers 601 and 602.

As now also shown in FIG. 1C, a CMP process employing slurry 2, as listed in Table 1, is then used to completely polish away the remaining CMP sacrifice layer 601 and 602. This process stops on the CMP stop layers 501 and 502, since slurry 2 has an extremely low polish rate for the material of the CMP stop layers.

Figure 1D:
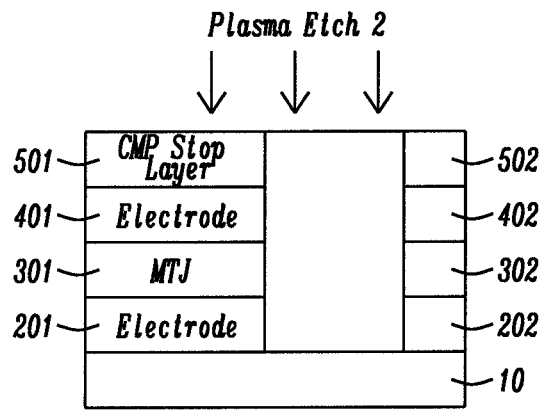
Figure 1E:
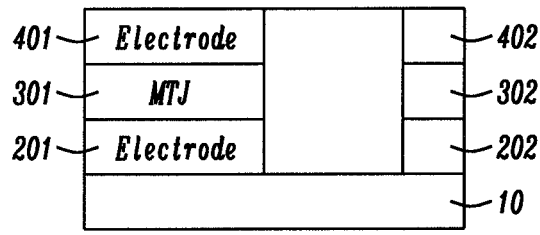

Next as shown schematically in FIG. 1D, a second plasma etch is applied again to etch back the CMP stop layer 501 and 502, exposing the upper surfaces of top electrode 401 and 402 underneath. As shown schematically in FIG. 1E, the resulting exposed top surfaces of the electrodes 401 and 402 are now coplanar and the two MTJ devices 301 and 302 are now electrically separate and completely defined by both upper 401, 402 and lower 201, 202 electrodes. At this point the devices are both at the same height and any height differences that were created by the first etch process shown in FIG. 1b have been eliminated.

Figure 1F:
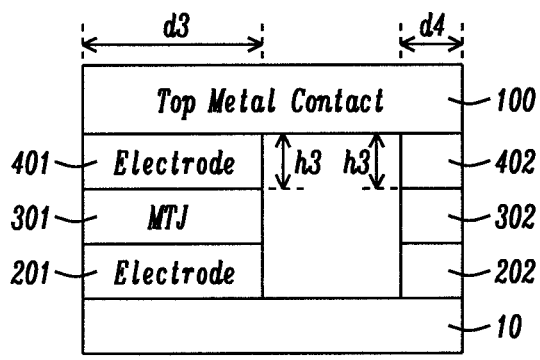

Finally as shown in FIG. 1F, a common top metal contact 100, such as a layer of Ta, TaN, Ti, Al or Cu is deposited onto the coplanar surfaces of top electrodes 401 and 402 to form an electrical connection to the two exemplary (and otherwise electrically separate) MTJ devices 301 and 302. Large size pattern final width d3 and small size pattern final width d4 each have their own separate top electrodes 401 and 402 with coplanar upper surfaces and the same top electrode thickness h3, preventing any yield loss due to formation of electric opens when the top connection 100 is formed.

As is finally understood by a person skilled in the art, the detailed description given above is illustrative of the present disclosure rather than limiting of the present disclosure. Revisions and modifications may be made to methods, materials, structures and dimensions employed in forming and providing a multiplicity of small (in the horizontal dimensional range of approx. 60 nm) MTJ devices having top electrodes of uniform thickness (vertical dimension) and thereby to improve device yield, while still forming and providing such a structure and its method of formation in accord with the spirit and scope of the present invention as defined by the appended claims.

What is claimed is:
1. An array of devices, the array comprising:
 a common substrate;
 a multiplicity of N spatially separated multilayered devices having coplanar upper surfaces, the N multilayered devices being formed on the common substrate, wherein each of the N multilayered devices has a respective width $d_n$ as measured in a first direction, the first direction being parallel to a top surface of the common substrate, where n runs from 1 to N, wherein the respective widths $d_n$ are different, wherein the N multilayered devices have a common height h as measured in a second direction, the second direction being perpendicular to the top surface of the common substrate, and wherein each of the N multilayered devices comprises:
  a lower electrode having a first edge and an opposing second edge as measured in the first direction, wherein the lower electrodes of adjacent multilayer devices have different widths;

an active device element formed on the lower electrode, the active device element having a third edge and an opposing fourth edge as measured in the first direction; and an upper electrode formed on the active device element, the upper electrode having a fifth edge and an opposing sixth edge as measured in the first direction, wherein the first, third, and fifth edges are vertically aligned, and wherein the second, fourth, and sixth edges are vertically aligned, wherein the upper electrodes of the N multilayered devices have identical thicknesses in the second direction, and wherein upper surfaces of the upper electrodes of the N multilayered devices are coplanar;

a single top metal contact formed over the upper electrodes of the N multilayered devices, the single top metal contact being common to the N multilayered devices, the single top metal contact making open-free electrical contact with the upper electrodes of the N multilayered devices; and a space-filling insulating layer disposed between the N multilayered devices, wherein a space defined by the common substrate, adjacent devices of the N multilayered devices, and the single top metal contact is entirely filled by the space-filling insulating layer.

2. The array of claim 1 wherein the lower electrode and the upper electrode of each of the N multilayered devices are formed of Ta, Ti, TaN or TiN, of thicknesses between approximately 200-1000 A.

3. The array of claim 1 wherein the active device element of each of the N multilayered devices is an MTJ (magnetic tunnel junction) device.

4. The array of claim 1 wherein at least one of the respective widths $d_n$ is approximately 60 nm or less.

5. The array of claim 1 wherein the space-filling insulating layer is a layer of SiN or SiCN.

6. An array of devices, the array comprising:
a single metal layer;
a first multilayer device disposed on the single metal layer such that the first multilayer device physically contacts the single metal layer;
a second multilayer device disposed on the single metal layer such that the second multilayer device physically contacts the single metal layer, the second multilayer device being laterally adjacent to the first multilayer device, a width of the first multilayer device being different from a width of the second multilayer device, a height of the first multilayer device being equal to a height of the second multilayer device, the widths being measured in a first direction parallel to a top surface of the single metal layer, the heights being measured in a second direction perpendicular to the top surface of the single metal layer, wherein each of the first multilayer device and the second multilayer device includes:
a first electrode disposed on the single metal layer, the first electrode having a first sidewall and a second sidewall opposite the first sidewall in the first direction, the first sidewall and the second sidewall being separated by a first distance in the first direction;
a magnetic tunnel junction cell disposed on the first electrode, the magnetic tunnel junction cell having a third sidewall and a fourth sidewall opposite the third sidewall in the first direction, the third sidewall and the fourth sidewall being separated by a second distance in the first direction; and a second electrode disposed on the magnetic tunnel junction cell, the second electrode having a fifth sidewall and a sixth sidewall opposite the fifth sidewall in the first direction, the fifth sidewall and the sixth sidewall being separated by a third distance in the first direction, wherein the first, second, and third distances are equal, wherein the first, third, and fifth sidewalls are vertically aligned, and wherein the second, fourth, and sixth sidewalls are vertically aligned;

a dielectric material filling an entirety of a space between the first multilayer device and the second multilayer device, the dielectric material having an uppermost surface that extends continuously from an uppermost surface of the first multilayer device to an uppermost surface of the second multilayer device, wherein the uppermost surfaces of the first multilayer device, the second multilayer device, and the dielectric material are coplanar; and a single metal contact disposed on the first multilayer device, the second multilayer device, and the dielectric material such that the single metal contact physically contacts the first multilayer device, the second multilayer device, and the dielectric material, the single metal contact being a common contact for the first multilayer device and the second multilayer device.

7. The array of claim 6, wherein the single metal contact is disposed on upper surfaces of the second electrodes of the first multilayer device and the second multilayer device.

8. The array of claim 6, wherein the second electrodes of the first multilayer device and the second multilayer device includes a material selected from a group consisting of Ta, Ti, TaN and TiN.

9. The array of claim 6, wherein the height of the second electrode of the first multilayer device and the height of the second electrode of the second multilayer device is between 200 Angstroms and 1000 Angstroms.

10. The array of claim 6, wherein a height of the first electrode of the first multilayer device is equal to a height of the first electrode of the second multilayer device.

11. The array of claim 6, wherein the width of the first multilayer device is between 60 nanometers and 100 nanometers, and wherein the width of the second multilayer device is between 10 nanometers and 60 nanometers.

12. The array of claim 6, wherein the dielectric material comprises a material selected from a group consisting of SiN and SiCN.

13. The array of claim 6, wherein a bottom surface of the single metal contact physically contacts the uppermost surfaces of the first multilayer device, the second multilayer device, and the dielectric material.

14. The array of claim 6, wherein the single metal layer includes a material selected from a group consisting of Ta, Ti, TaN and TiN.

15. An array of devices, the array comprising:
a plurality of multilayered devices disposed on a metal substrate and laterally separated from one another, each of the plurality of multilayered devices having a respective device width measured in a first direction that is parallel to a top surface of the metal substrate, wherein the respective device widths are different, the plurality of multilayered devices having a common height as measured in a second direction perpendicular to the top surface of the metal substrate, each of the plurality of multilayered devices comprising:
a bottom electrode disposed on the metal substrate, wherein the bottom electrode includes a first edge and an opposing second edge in the first direction, wherein the bottom electrodes of adjacent multilayer devices have different widths;

an active device disposed on the bottom electrode, wherein the active device includes a third edge and an opposing fourth edge in the first direction; and a top electrode disposed on the active device, wherein the top electrode includes a fifth edge and an opposing sixth edge in the first direction, wherein the first, third, and fifth edges are vertically aligned, and wherein the second, fourth, and sixth edges are vertically aligned, and wherein the top electrode of each of the plurality of multilayered devices has a same thickness in the second direction;

a top metal contact disposed on the top electrodes of the plurality of multilayered devices, the top metal contact being a common contact for the plurality of multilayered devices; and a dielectric encapsulant disposed between adjacent devices of the plurality of multilayered devices, the dielectric encapsulant filling an entirety of a space defined by the metal substrate, the adjacent devices, and the top metal contact, wherein a bottommost surface of the top metal contact, topmost surfaces of the top electrodes of adjacent devices, and a topmost surface of the dielectric encapsulant are coplanar.

16. The array of devices of claim 15, wherein the device width of a first device of the plurality of multilayered devices is between 60 nanometers and 100 nanometers, and wherein the device width of a second device of the plurality of multilayered devices is between 10 nanometers and 60 nanometers.

17. The array of devices of claim 15, wherein the dielectric encapsulant comprises a material selected from a group consisting of SiN and SiCN.

18. The array of devices of claim 15, wherein the top electrodes of the plurality of multilayered devices have a common height as measured in the second direction.

19. The array of devices of claim 15, wherein the active device of each of the plurality of multilayered devices comprises a magnetic tunnel junction device.

20. The array of devices of claim 15, wherein the metal substrate is a further common contact that physically contacts a bottom surface of the bottom electrode of each of the plurality of multilayered devices.

* * * * *